United States Patent [19]
Schueller et al.

[11] Patent Number: 5,990,545
[45] Date of Patent: *Nov. 23, 1999

[54] CHIP SCALE BALL GRID ARRAY FOR INTEGRATED CIRCUIT PACKAGE

[75] Inventors: Randolph Dennis Schueller; John David Geissinger, both of Austin, Tex.

[73] Assignee: 3M Innovative Properties Company, St. Paul, Minn.

[ * ] Notice: This patent issued on a continued prosecution application filed under 37 CFR 1.53(d), and is subject to the twenty year patent term provisions of 35 U.S.C. 154(a)(2).

[21] Appl. No.: 08/759,253

[22] Filed: Dec. 2, 1996

[51] Int. Cl.$^6$ .................................................. H01L 23/48
[52] U.S. Cl. ........................ 257/697; 257/778; 257/678
[58] Field of Search .................... 257/684, 697, 257/778, 720, 707, 678, 692, 693, 729

[56] References Cited

U.S. PATENT DOCUMENTS

| | | | |
|---|---|---|---|
| 4,264,917 | 4/1981 | Ugon | 357/74 |
| 5,148,265 | 9/1992 | Khandros et al. | 357/80 |
| 5,148,266 | 9/1992 | Khandros et al. | 357/80 |
| 5,214,845 | 6/1993 | King et al. | 29/841 |
| 5,216,278 | 6/1993 | Lin et al. | 257/688 |
| 5,241,133 | 8/1993 | Mullen, III et al. | 257/787 |
| 5,311,059 | 5/1994 | Banerji et al. | 257/778 |
| 5,376,588 | 12/1994 | Pendse | 437/211 |
| 5,397,921 | 3/1995 | Karnezos | 257/779 |
| 5,420,460 | 5/1995 | Massingill | 257/693 |
| 5,473,512 | 12/1995 | Degani et al. | 361/760 |
| 5,477,611 | 12/1995 | Sweis et al. | 29/840 |
| 5,528,083 | 6/1996 | Malladi et al. | 257/786 |
| 5,548,091 | 8/1996 | DiStefano et al. | 174/260 |
| 5,561,323 | 10/1996 | Andros et al. | 257/707 |
| 5,592,025 | 1/1997 | Clark et al. | 257/774 |
| 5,640,047 | 6/1997 | Nakashima | 257/738 |
| 5,674,785 | 10/1997 | Akram et al. | 437/217 |

FOREIGN PATENT DOCUMENTS

| | | | |
|---|---|---|---|
| 0 517 247 A2 | 5/1992 | European Pat. Off. | H01L 23/498 |
| 0 692 823 A1 | 1/1996 | European Pat. Off. | H01L 23/498 |
| 0 751 561 A1 | 1/1997 | European Pat. Off. | H01L 23/12 |
| 2 725 305 A1 | 4/1996 | France | H01L 23/12 |

OTHER PUBLICATIONS

*Electronic Packaging and Production,* vol. 34, No. 6, Jun. 1, 1994, p.40 XP000455309. Matthew, Linda: "Die Grid Array Package Provides KGD Solution".

*Japanese Journal of Applied Physics,* vol. 28, No. 9, Part 01, Sep. 1, 1989, pp. 1578–1585 XP000072802. Yoshitaka Fukuoka et al.: "An Application of the Thermal Network Method to the Thermal Analysis of Multichip Packages (Proposal of a Simple Thermal Analysis Model)".

*International Journal of Microcircuits and Electronic Packaging,* vol. 18, No. 2, Apr. 1, 1995, pp. 122–132 XP000522299. Hawkins, G. et al.: "The PBGA: A Systematic Study of Moisture Resistance".

*Primary Examiner*—Nathan K. Kelley
*Attorney, Agent, or Firm*—Matthew B. McNutt

[57] ABSTRACT

A chip scale ball grid array for integrated circuit packaging having a nonpolymer layer or support structure positioned between a semiconductor die and a substrate. The nonpolymer support structure acts to increase circuit reliability by reducing thermal stress effects and/or by reducing or eliminating formation of voids in an integrated circuit package. A nonpolymer support structure may be a material, such as copper foil, having sufficient rigidity to allow processing of chip scale package in strip format.

10 Claims, 9 Drawing Sheets

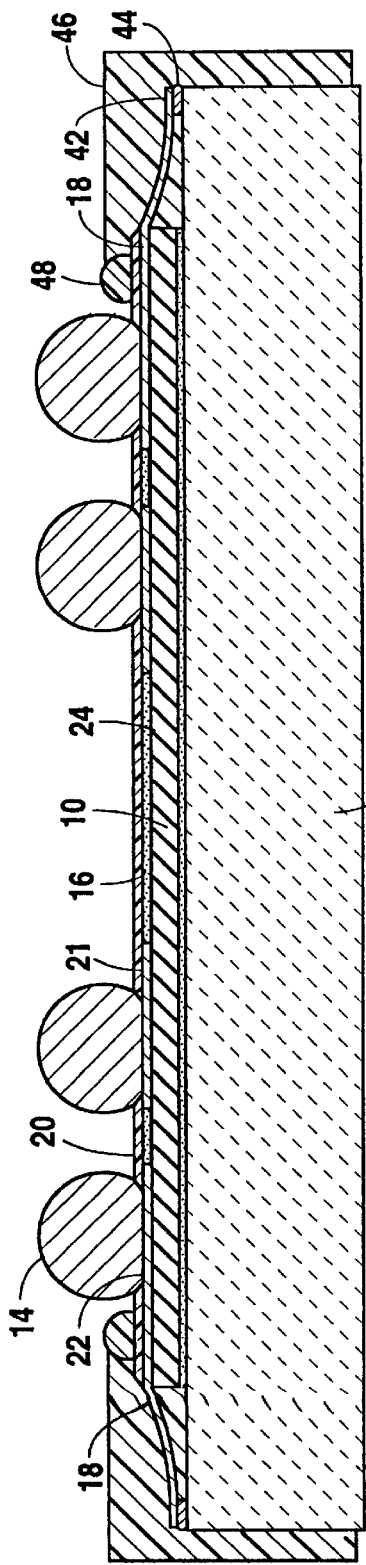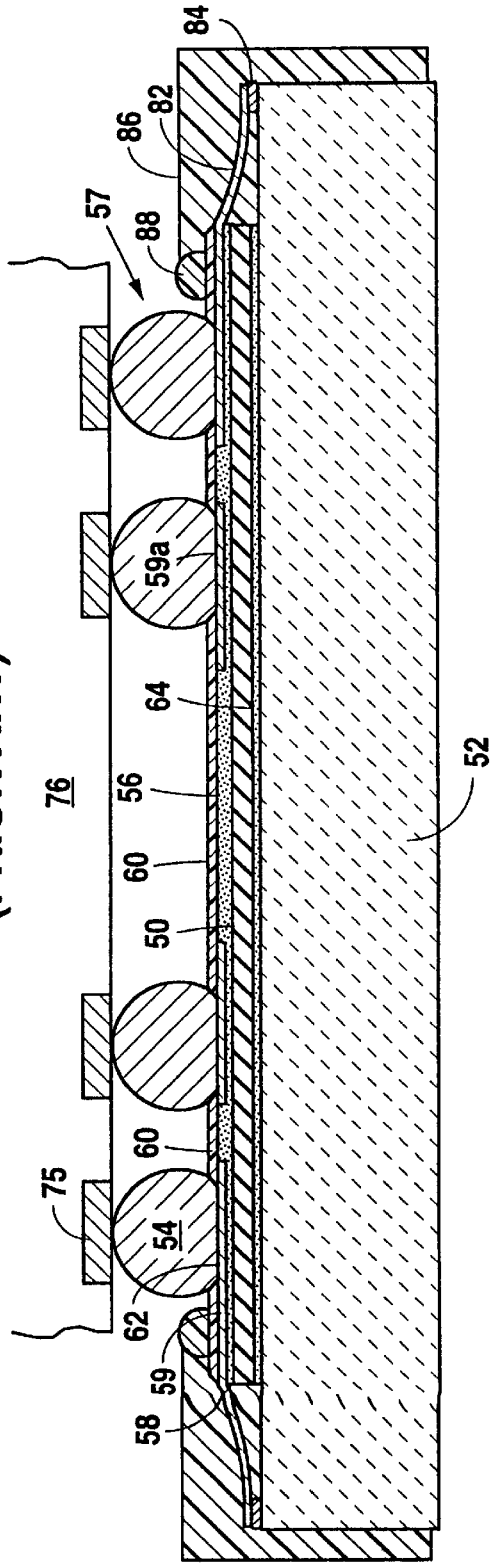

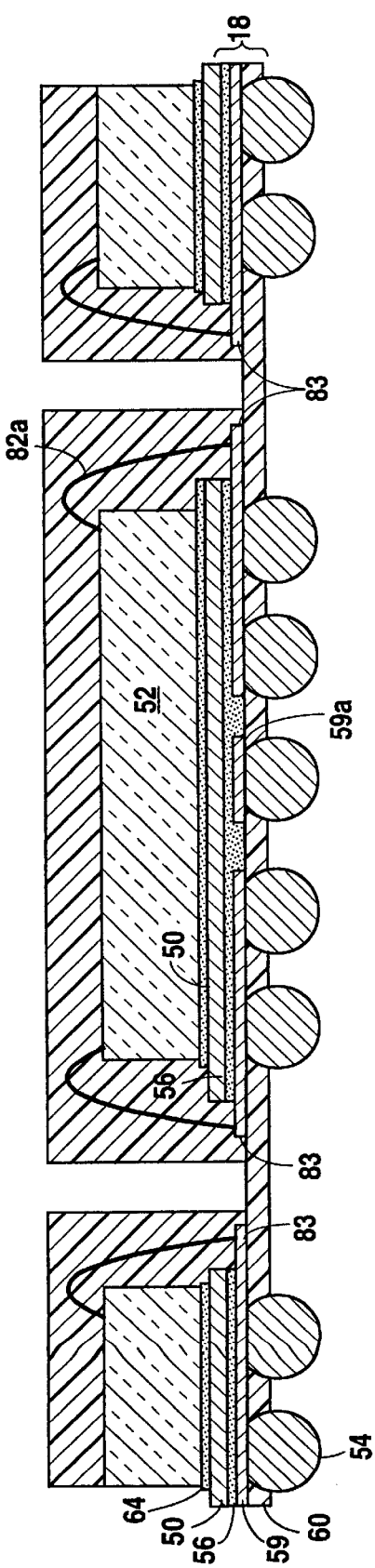
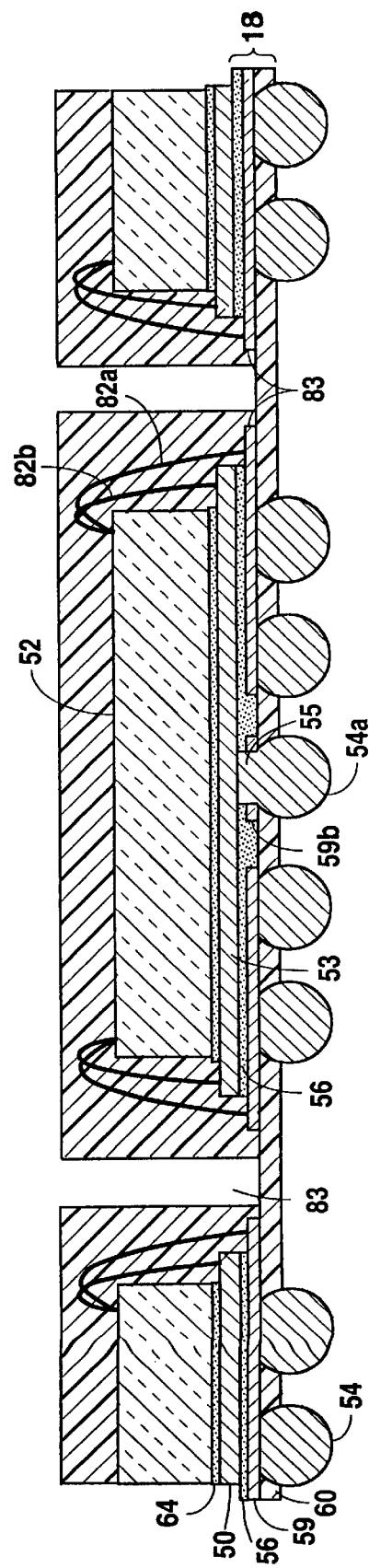
Fig. 3A
Fig. 3B

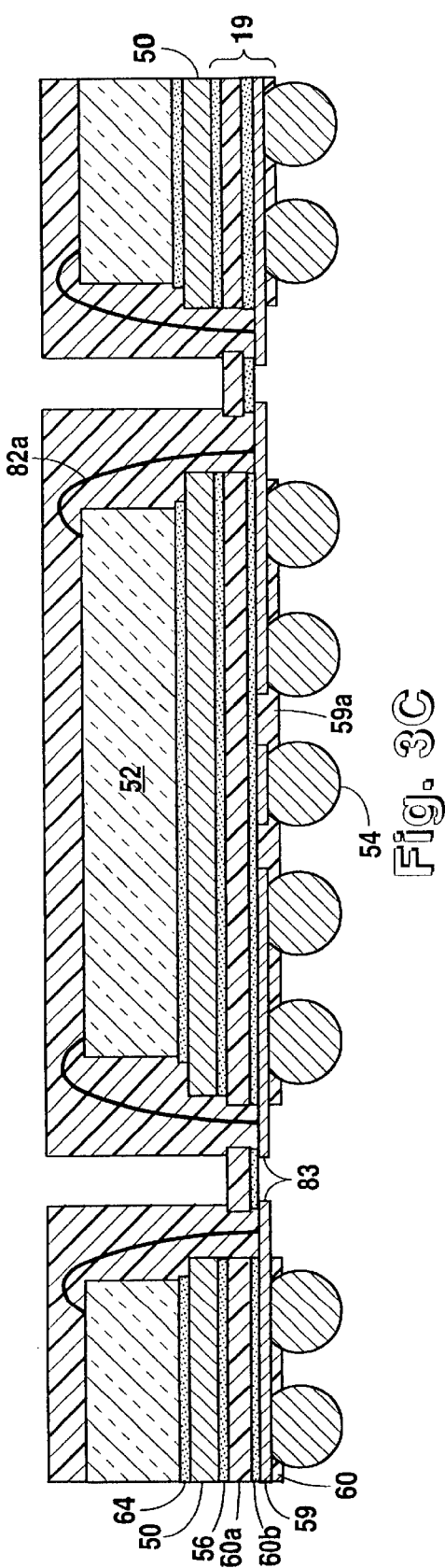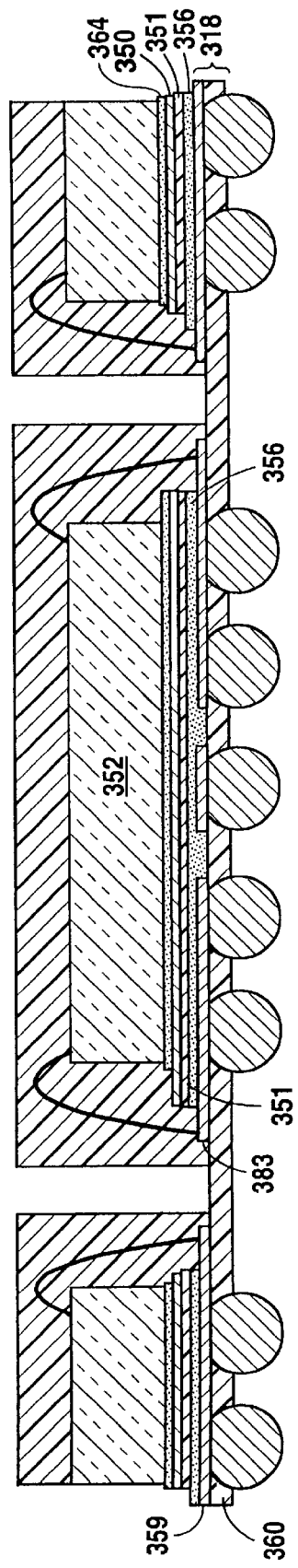

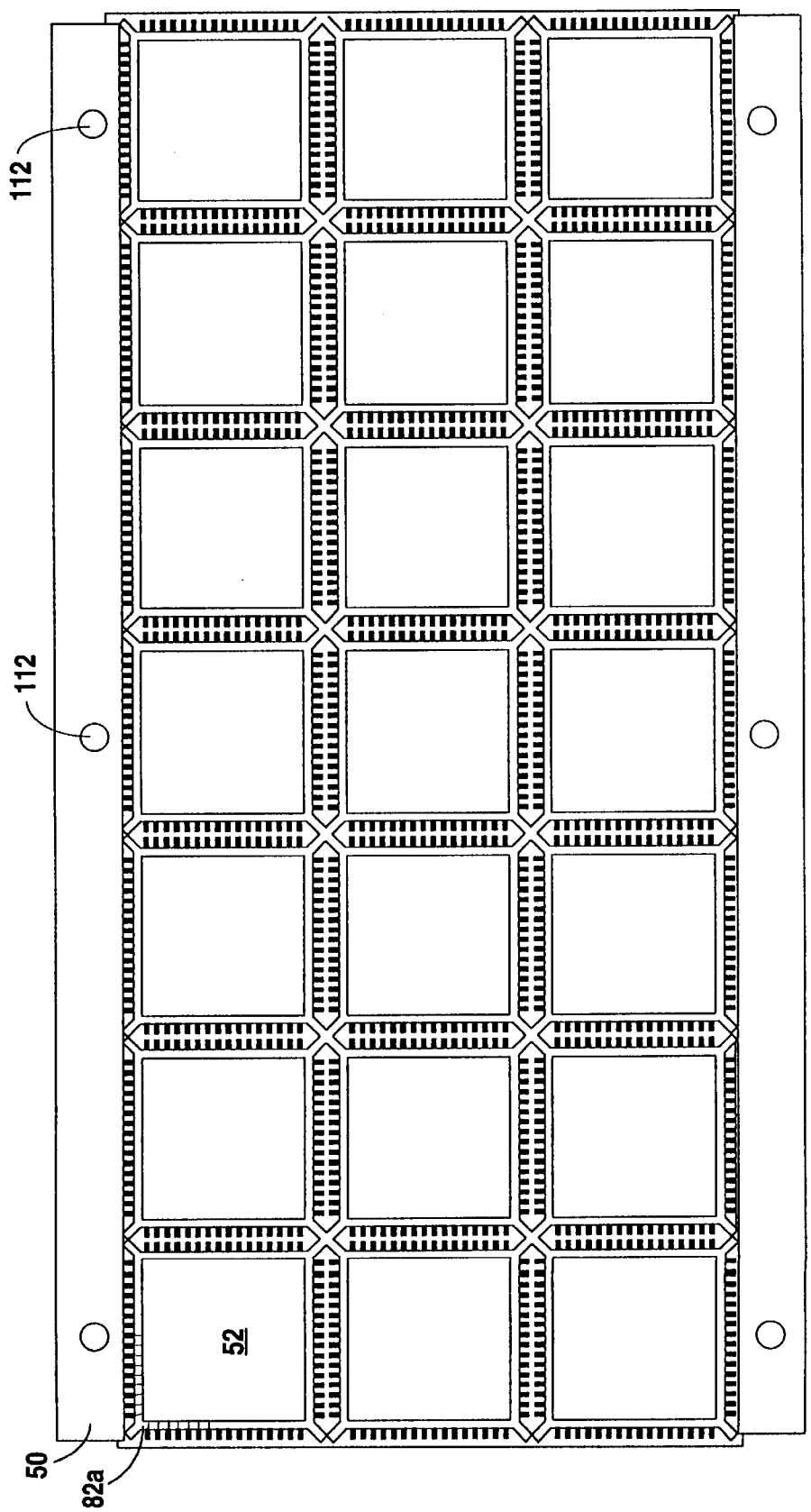

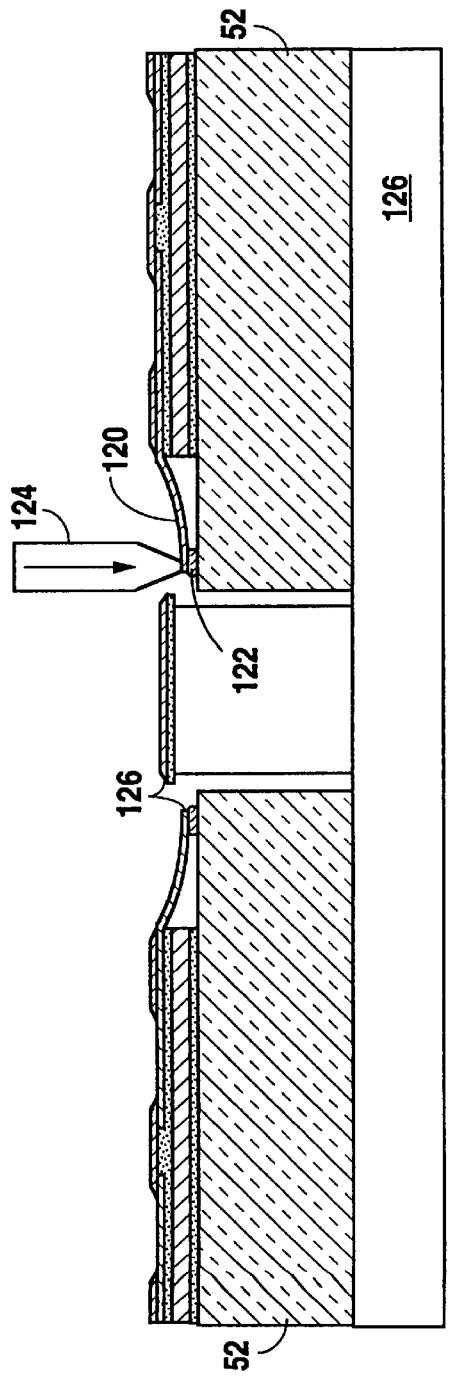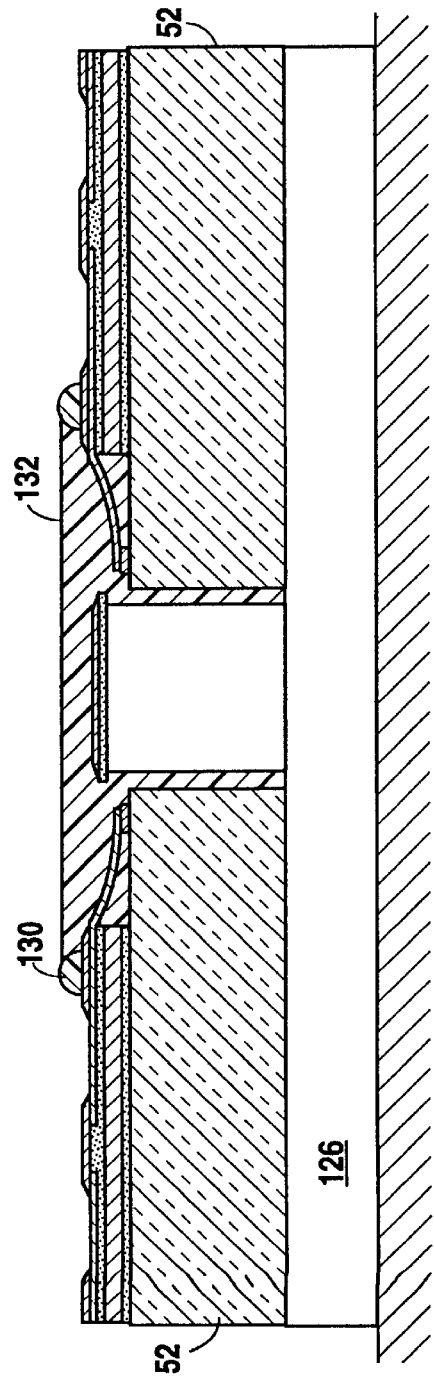

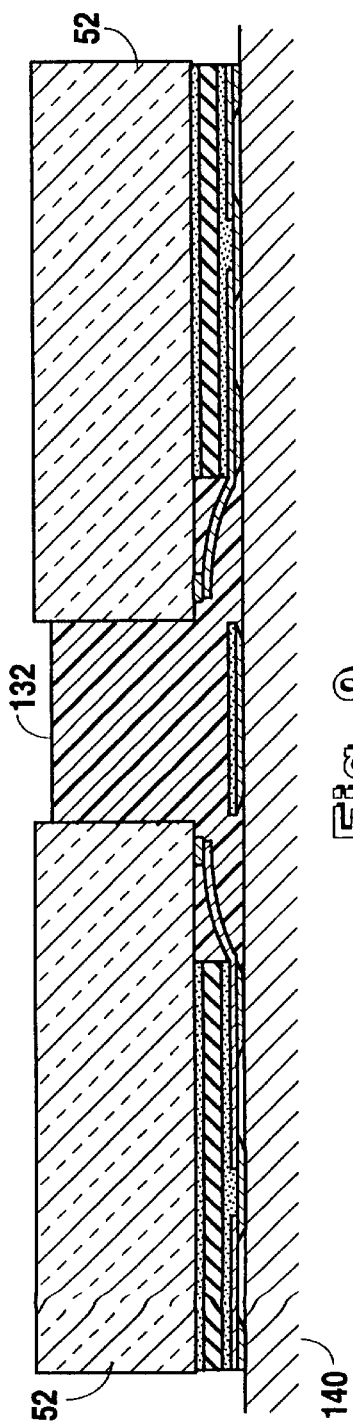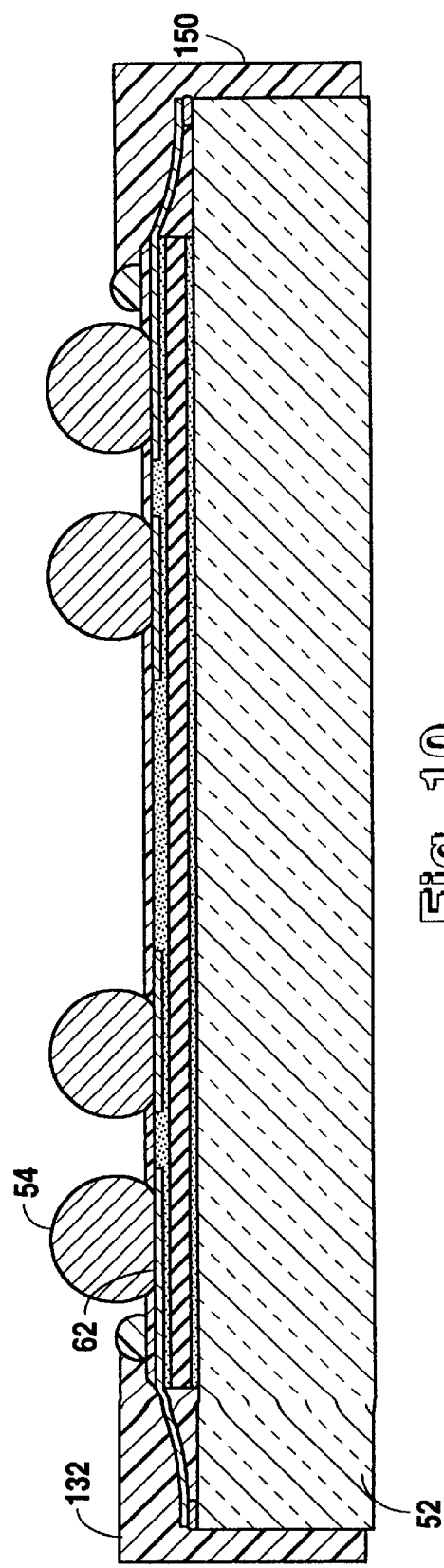

CHIP SCALE BALL GRID ARRAY FOR INTEGRATED CIRCUIT PACKAGE

BACKGROUND OF THE INVENTION

1. Field of the Invention

This invention relates generally to integrated circuit packaging, and more specifically to ball grid arrays. In particular, this invention relates to a chip scale ball grid array design employing a flex tape having a nonpolymer support structure.

2. Description of the Related Art

The demand for a reduction in size and an increase in sophistication of electronic components has driven the industry to produce smaller and more complex integrated circuits (ICs). These same trends have forced IC packages to have smaller footprints, higher lead counts and better electrical and thermal performance. At the same time, these IC packages are also required to meet accepted reliability standards.

With reduction in device sizes and corresponding increase in circuit complexity, integrated circuit packages are required to have smaller footprints, higher lead counts and higher electrical and thermal performance. At the same time, integrated circuit packages are also required to meet accepted reliability standards.

Ball grid array (BGA) packages were developed to meet the demand for integrated circuit packages having higher lead counts and smaller footprints. A BGA package is typically a square package with terminals, normally in the form of an array of solder balls, protruding from the bottom of the package. These terminals are designed to be mounted onto a plurality of bonding pads located on the surface of a printed circuit board (PCB) or other suitable substrate.

Recently, BGA packages have been fabricated using a tape automated bonding (TAB) process and flexible circuitry (sometimes referred to as TAB tape) which typically consists of copper traces on a thin polyimide substrate. Electrically conductive leads may be laminated on one or both sides of the TAB tape. This BGA design is commonly referred to as a Tape BGA (TBGA). In a TBGA design, the circuitry on the tape has leads which are connected to a semiconductor die through any of the conventional methods such as wire bonding, thermocompression bonding, or flip chips. If the circuitry is present on both sides of the tape, electrically conducting vias may extend through the tape from one layer of circuitry to another.

For some applications such as portable electronic components (cellular phones, disk drives, pagers, etc.), even BGA packages are sometimes too large. Consequently, solder bumps are sometimes deposited directly onto the surface of an IC itself and used for attachment to the PCB (commonly referred to as direct chip attach or flip chip). However, there are a number of problems associated with this approach. First, the deposition of solder balls requires a number of costly process steps. In addition, it is typically necessary to deposit a polymer underfill beneath a die to achieve acceptable reliability with flip chip attach to a PCB. This underfill is required to reduce thermal stress which is caused by the low thermal expansion of a die relative to the typically much higher expansion of a PCB ("thermal mismatch stress"). Deposition of this underfill is a costly process which eliminates the ability to rework the component. Consequently, if any defects are found, a valuable PCB must be thrown out.

To address concerns associated with flip chip processing, another class of BGA packages have been developed. This class of BGA package may be referred to as a chip scale ball grid array or a chip scale package (CSP). Chip scale packages are so called because the total package size is similar or not much larger than the size of the IC itself. In a chip scale package, solder ball terminals are typically disposed underneath a semiconductor die in order to reduce package size. One example of a CSP is a product developed by TESSERA called "MICRO BGA." This product consists of a flexible circuit with a soft compliant elastomer layer (or elastomer pad) between the die and the circuit. This elastomeric member consists of polymer materials such as silicone and is typically about 5–7 mils thick. One purpose of the elastomer is to obtain suitable reliability by minimizing thermal mismatch stress between the die and the PCB without the need for expensive underfill material.

Although current chip scale package designs offer improved board space utilization and ease of surface mount assembly, these products suffer from a number of shortcomings. First, it is often difficult to find a suitable elastomer material which meets industry requirements of low moisture absorption, low outgassing, and the ability to withstand cleaning solvents commonly used in the industry. For example, silicone is known to breakdown with some typically used cleaning solvents, and polymer materials in general tend to absorb and outgas moisture. If moisture absorption is too high, rapid outgassing of this moisture at reflow temperatures will cause voids to form at component interfaces and even bursting of the package. For example, moisture may release from polymer materials in a tape and become trapped within the die attachment adhesive.

Voids may then be formed when this trapped moisture expands during board assembly heating operations, typically causing cracking and package failure. Formation of such voids may be particularly acute during reflow attachment to a PCB.

Another significant challenge with chip scale package designs is the process for attaching the elastomer to the flex tape. One method commonly employed is to pick and place elastomer pads onto individual sites while another method involves screen printing is a fluid polymer followed by a cure. In either case, it is difficult to meet the tight tolerances required for a CSP application. Yet another concern is package flatness. In a typical CSP design, it is critical that the package flatness (coplanarity) be less than about 1 mil to ensure that all solder balls contact the PCB upon reflow. This level of flatness or coplanarity may be difficult to achieve with soft polymer and elastomer materials commonly used. Finally, if a die is not adequately isolated from other parts of a package, premature failure of solder ball joints may occur due to thermal stress generated between an assembled die and a substrate, such as a circuit board.

It is often desired to handle IC packages in strip format since a great deal of equipment currently exists for handling this configuration. For example, lead frames for quad flat packs have typically been processed in strips of four to eight units. Plastic BGA packages and some TBGA packages have also been produced in strip format for easy handling through the assembly process. Such strips are loaded into magazines which are used to feed assembly equipment for die attach, wire bonding, overmolding/encapsulating, solder ball attach, and other processing steps. Although some assemblers may desire to perform these processes in a reel to reel fashion, many may prefer the conventional strip format. However, conventional CSP designs employing elastomer pads lack sufficient rigidity for conventional strip format processing without some additional source of rigidity. For example, the TESSERA "MICRO BGA" design employs a metal frame adhered to the outer edge of a strip of parts to allow strip format processing. The use of such frames is not convenient and adds to the final cost of a product because it increases the complexity and number of components in a tape processing design, as well as requires additional steps to attach and remove the frames during processing. Therefore, although strip format processing has typically been used for integrated circuit packaging, no convenient strip format chip scale package design current exists.

In other CSP designs, elastomer pads have been directly laminated to circuitry and semiconductor dies without using layers of adhesive in an effort to eliminate void formation in adhesive layers. However, these designs still may suffer from thermal stress problems and do not possess sufficient rigidity for strip format processing.

In still other CSP designs, such as the TEXAS INSTRUMENTS "MICRO STAR BGA," an IC is adhered directly to the surface of a flex circuit without a polymer or elastomer pad. This structure does not decouple the die from the PCB, consequently, an expensive underfill material is required to achieve the required reliability in the solder joints. In addition, it has been found that moisture from polymer materials employed in this design outgasses during curing of the die attach adhesive, causing voids in the adhesive.

Consequently, a need exists for a low cost and solvent resistant chip scale package which has sufficient coplanarity, and which does not suffer from moisture and thermal stress related problems. A need also exists for a chip scale package which may be easily produced in strip format.

SUMMARY OF THE INVENTION

The disclosed method and apparatus relate to chip scale ball grid arrays for integrated circuit packaging. These products may be used to provide low cost chip scale packages that offer improved reliability and which facilitate processing.

In the disclosed embodiments, a nonpolymer layer or support structure is used between a semiconductor die and accompanying circuitry. When employed as a support structure, a nonpolymer layer may be used to provide a substantially rigid and planar surface, as well as to separate or decouple the die from a substrate, such as a printed circuit board (PCB). In a typical embodiment, adhesive materials are also employed between a nonpolymer support structure and adjacent components of a chip scale package assembly for purposes of attachment and to further decouple a die and substrate. By decoupling a die and substrate, the nonpolymer support structure reduces thermal stress. Because the support structure is nonpolymeric, void creation between the support structure and a die is substantially eliminated. The nonpolymer support structure also offers sufficient rigidity to allow integrated circuit processing in strip formats. When employed as a layer that is thinner and less rigid than a support structure layer, nonpolymer material acts to substantially eliminate the formation of voids, among other things.

In one aspect, this invention is a package for an integrated circuit including an intermediate circuit having an array of electrical interconnects and at least one nonpolymer layer having first and second sides. The first side of the nonpolymer layer is structurally coupled to the integrated circuit, and the second side of the nonpolymer layer is structurally coupled to the intermediate circuit.

In another aspect, this invention is a method of forming a package for an integrated circuit including the steps of providing an intermediate circuit including an array of electrical interconnects, and providing at least one nonpolymer layer having a first side adapted for structural coupling to an integrated circuit. This method also includes the step of structurally coupling the second side of the nonpolymer layer to the intermediate circuit.

In another aspect, this invention is an electronic package including a flexible tape having a patterned conductive layer and at least one patterned dielectric layer. The package also includes at least one nonpolymer support structure having first and second sides. The first side of the support structure is structurally coupled to the second side of the conductive layer of the flexible tape.

In another aspect this invention is an electronic package, including a patterned conductive layer having first and second sides and an outer lateral boundary. The conductive layer is patterned to form an electrically conductive region having peripheral conductive features disposed around a circumference of the outer lateral boundary for electrical connection to a semiconductor device. The package also includes a patterned dielectric layer having first and second sides and an outer lateral boundary with a smaller circumference than the circumference of the patterned conductive layer. The dielectric layer is patterned to form a plurality of openings extending through the dielectric layer, with each of the openings being configured to receive a solder ball. The first side of the conductive layer is joined to the second side of the dielectric layer so that the plurality of openings in the dielectric layer are aligned with at least part of the electrically conductive region of the conductive layer, and so that the peripheral conductive features of the conductive layer extend beyond the outer boundary of the dielectric member. Also provided is a substantially rigid nonpolymer support structure having first and second sides, and having an elastic modulus greater than about 1 Mpsi. The first side of the support structure is structurally coupled to the second side of the conductive layer. The first side of a semiconductor device is structurally coupled to the second side of the nonpolymer support structure. The semiconductor device includes a plurality of electrical contact sites, with at least one of the contact sites being electrically coupled to the peripheral conductive features of the conductive layer. A plurality of solder balls are disposed on the first side of the dielectric layer, with each of the solder balls positioned in one of the plurality of openings in the dielectric layer and electrically connected to the conductive region of the conductive layer.

BRIEF DESCRIPTION OF THE DRAWINGS

FIG. 1 is a cross-sectional representation of a conventional chip scale package design of the prior art.

FIG. 3 is a cross-sectional representation of a chip scale package design according to one embodiment of the disclosed method and apparatus.

FIG. 3A is a cross-sectional representation of another chip scale package design according to one embodiment of the disclosed method and apparatus.

FIG. 3B is a cross-sectional representation of another chip scale package design according to one embodiment of the disclosed method and apparatus.

FIG. 3C is a cross-sectional representation of another chip scale package design according to one embodiment of the disclosed method and apparatus.

FIG. 3D is a cross-sectional representation of another chip scale package design according to one embodiment of the disclosed method and apparatus.

FIG. 6A is a top view of the nonpolymer sheet of FIG. 5 with an attached wire bonded die according to one embodiment of the disclosed method and apparatus.

FIG. 7 is a cross-sectional representation of a chip scale package strip positioned in a fixture for bonding according to one embodiment of the disclosed method and apparatus.

FIG. 8 is a cross-sectional representation of a chip scale package strip positioned in a fixture during overmolding according to one embodiment of the disclosed method and apparatus.

FIG. 9 is a cross-sectional representation of a chip scale package strip oriented die-side upwards on a fixture for encapsulation according to one embodiment of the disclosed method and apparatus.

FIG. 10 is a cross-sectional representation of a completed chip scale package according to one embodiment of the disclosed method and apparatus.

DESCRIPTION OF SPECIFIC EMBODIMENTS

Figure 2:
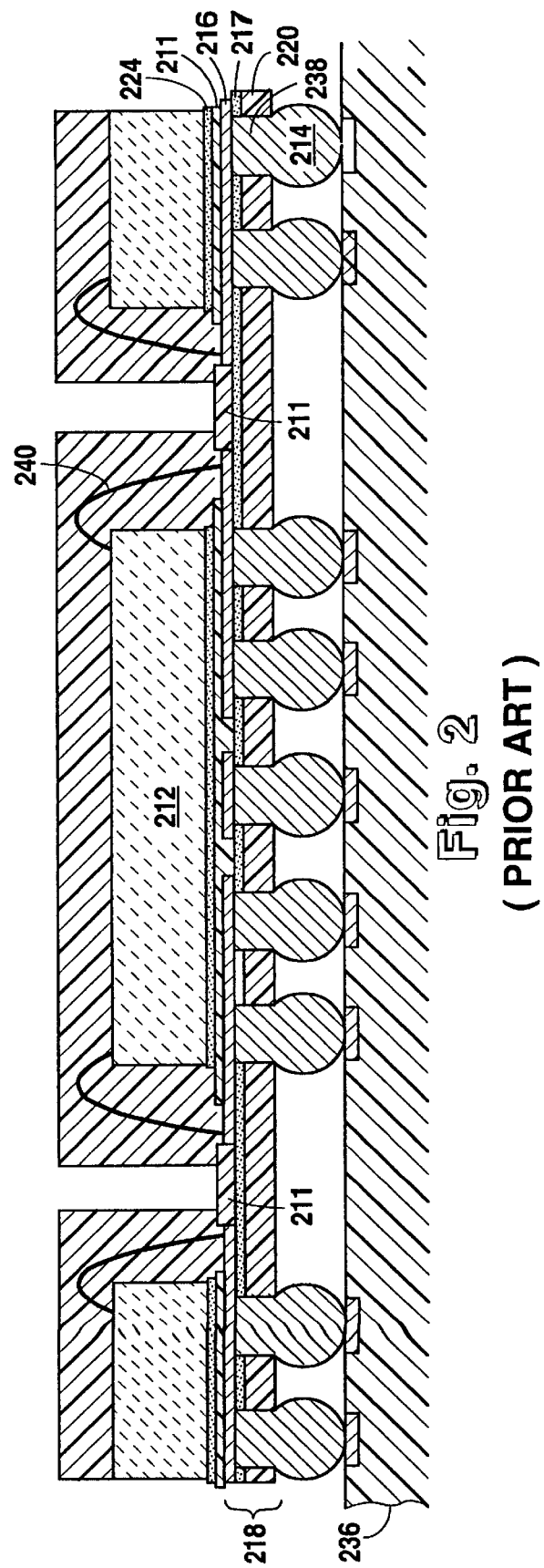
FIG. 2 is a cross-sectional representation of another conventional chip scale package design of the prior art.

FIG. 1 illustrates a conventional chip scale package integrated circuit package design having an elastomer pad 10 placed between a semiconductor die 12 and two piece flexible circuit tape 18. The elastomer pad 10 is often applied as part of a tape and may have adhesive layer 16 and adhesive layer 24 disposed on each side. A two piece tape is often employed, although tape having three or more layers may also be used. In one method, two piece flexible circuit tape 18 is attached to elastomer pad 10 by adhesive layer 16 and includes a patterned dielectric (typically polyimide) layer 20 and a patterned conductive layer 21. Alternatively, adhesive layers 16 and/or 24 may be absent and elastomer pad 10 applied onto a tape 18, such as by screen printing. Two piece flexible tape 18 may be formed, for example, by plating or sputtering a conductive metal layer 21 directly onto a dielectric layer 20. Conductive layer 21 may be patterned by selective plating or plate and etch methods. Conductive layer 21 is formed, for example, by sputtering conductive metal directly onto dielectric layer 20. Dielectric layer 20 is patterned with openings (or vias) 22 for accepting solder balls (or bumps) 14 so that solder balls 14 make electrical contact with patterned conductive layer 21.

As shown in FIG. 1, adhesive layer 16 may deform (or be compressed) between the patterned conductive material of layer 21 and elastomer pad 10, while at the same time filling spaces between elastomer pad 10 and dielectric layer 10 in those areas where patterned conductive material is not present. For example, adhesive layer 16 may be a thickness of about 2 mils before deformation and be compressed to a thickness of between about 0.5 mil and about 1.5 mils between patterned conductive layer 21 and elastomer pad 10. Semiconductor die 12 is attached to elastomer pad 10 by adhesive layer 24. In the chip scale package design shown in FIG. 1, inner lead bonding is provided between circuit leads 42 and die pads 44. Edges of the semiconductor die 12, including the inner lead bonding areas, are encapsulated with encapsulant 46 which is contained within encapsulant dams 48.

In the conventional chip scale package design of FIG. 1, elastomer pad 10 is typically an elastomer with a relatively low modulus that is employed to isolate or "decouple" the integrated circuit from solder joints made to a PCB or other substrate in an attempt to reduce the stress on the solder joint and increase circuit reliability over periods of thermal cycling. However, in conventional chip scale package designs such as that shown in FIG. 1, selection of a suitable elastomer is often difficult. This is because it is difficult to find elastomer materials which meet the stringent requirements of integrated circuit packaging. Moreover, processes for attaching elastomer pads to other circuit components are typically rife with challenges, such as achieving accurate placement or dealing with the typical messiness of screen printing and curing. Typical elastomer materials utilized include silicone based materials and low modulus epoxies.

FIG. 2 shows another conventional chip scale package integrated circuit design using three layer flexible circuit tape and "punched" vias. In FIG. 2, a relatively thick dielectric layer 220 is bonded to a patterned conductive circuit layer 216 using an adhesive layer 217 to form a three layer tape. A relatively thick polymer covercoat layer 211 is deposited directly onto three layer tape 218 and attached to semiconductor die 212 with adhesive layer 224. Covercoat layer 211 is typically a polymeric material having a thinner cross section (around 1 mil), but higher modulus than the elastomer pad 10 of FIG. 1. Typically, covercoat 211 is an epoxy based material. In this conventional application, the three layer tape/flex circuitry combination is typically configured as a "strip" and is fairly rigid so that the strip may be removed and placed into a fixture for overmolding of a die without bending bond wires 240 during the transfer step.

Still referring to FIG. 2, voids may form in adhesive layer 224 due to moisture which has released from polymer layers, such as dielectric layer 220 (typically a polyimide) and covercoat 211 upon curing of die attachment adhesive 224 (typically performed at around 150° C.). Further creation of voids typically occurs during solder reflow attachment of solder balls 214 to a substrate such as a PCB board 236. Also possible is the formation of thermal cracks formed in solder balls 214. Thermal cracks are typically caused by thermal stress generated between die 212 and attached substrate 236. Such thermal cracking may be the cause of premature failure of solder ball joints 238.

Chip Scale Package Assemblies with Nonpolymer Support Structures

In embodiments of the disclosed method and apparatus, a nonpolymer support structure (or pad) is used between a semiconductor device or integrated circuit (such as a semiconductor die) and accompanying circuitry to provide a substantially rigid and planar surface, and to separate or decouple the die from a substrate, such as a PCB. In a typical embodiment, adhesive materials are also employed between a nonpolymer support structure and adjacent components of a chip scale package assembly for purposes of attachment and to further decouple a die and substrate. Typically, a nonpolymer support structure having a coefficient of thermal expansion (CTE) close to that of the substrate is employed to minimize thermal stress effects on solder joints.

FIG. 3 shows a cross-sectional view of a chip scale package design according to one embodiment of the disclosed method and apparatus having a nonpolymeric support structure 50 disposed between a semiconductor die 52 and an intermediate circuit comprising two layer flexible circuit tape (or flex circuit or TAB tape) 58. In this embodiment, nonpolymer support structure 50 is structurally coupled to the die 52 by means of adhesive layer 64. As used herein, "structurally coupled" means two components are directly coupled or indirectly coupled (e.g., with intervening layers or other components positioned between) using any suitable means (such as by deposition, with adhesive, or other forms of bonding). As shown in FIG. 3, semiconductor die 52 typically has die bond pads or contacts 84. A second adhesive layer 56 attaches nonpolymer pad 50 to the flexible tape 58. Although FIG. 3 illustrates an embodiment of a chip scale package design employing two layer flexible circuit tape, it will be understood with benefit of the present disclosure that embodiments employing other types of intermediate circuitry, for example, nonflexible circuit strips or flexible circuit tapes having three or more layers are also possible. For example, one embodiment employing three layer tape 19 and wire bonding is illustrated in FIG. 3C. In this embodiment, three layer tape 19 includes dielectric layer 60, conductive layer 59, and second dielectric layer (typically polyimide) 60a. Adhesive layer 60b is employed between layers 59 and 60a.

Intermediate circuitry typically includes an array of interconnects for electrical connection to a substrate, such as a PCB. In the embodiment illustrated in FIG. 3, two layer flexible circuit tape 58 typically includes a patterned dielectric layer 60, and a patterned planar conductive layer 59 having individual conductive bonding pads 59a. Solder ball conductive pads 59a are typically from about 200 microns to about 600 microns in diameter and have a pitch of between about 300 microns and about 1250 microns. Patterned conductive layer 59 may be comprised of any patternable conductive material suitable for forming substantially planar circuitry including, but not limited to, metals or conductors such as silicon and polysilicon, tungsten, titanium, aluminum, aluminum based metals (such as aluminum alloys), copper, and alloys and combinations thereof, etc. (for purposes of this disclosure the term "metals" is defined to include metals, refractory metals, intermetallics, and the like or combinations thereof). Most typically patterned conductive layer 59 is copper. Patterned dielectric layer 60 may be comprised of any patternable dielectric material suitable for insulating conductive layer 59 including, but not limited to, polyimide or polyester. Most typically dielectric layer 60 is a polyimide, such as "DUPONT KAPTON" or "UBE UPILEX." Patterned conductive layer 59 typically has a thickness of between about 0.5 mils to about 1.5 mils. Patterned dielectric layer 60 typically has a thickness of between about 1 mils to about 3 mils.

To form a ball grid array 57, conductive solder balls (or bumps) 54 are attached to flexible tape 58 and make electrical contact with individual pads 59a through openings (or vias) 62 patterned in dielectric layer 60. Openings 62 are patterned in a manner complementary with conductive pads 59a so that each opening 60 overlays a respective conductive pad 59a. Solder balls 54 may be any shape and dimension suitable for making connection with bonding pads 59a through openings 62. Typically, solder balls 54 are substantially spherical in shape and have a diameter of from about 250 microns to about 750 microns, most typically between about 300 microns and about 600 microns. Solder balls are typically reflow attached using conventional ovens such as IR, convection, or vapor phase. Openings 62 are sized and shaped to accept solder balls 54 in such a way that electrical contact may be made with bonding pads 59a. Typically, openings 62 are circular and have a diameter of between about 250 microns and about 600 microns, more typically between about 300 microns and about 500 microns. Conductive solder balls may be constructed of any suitable conductive material including, but not limited to, gold, solder, or copper.

Figure 6:
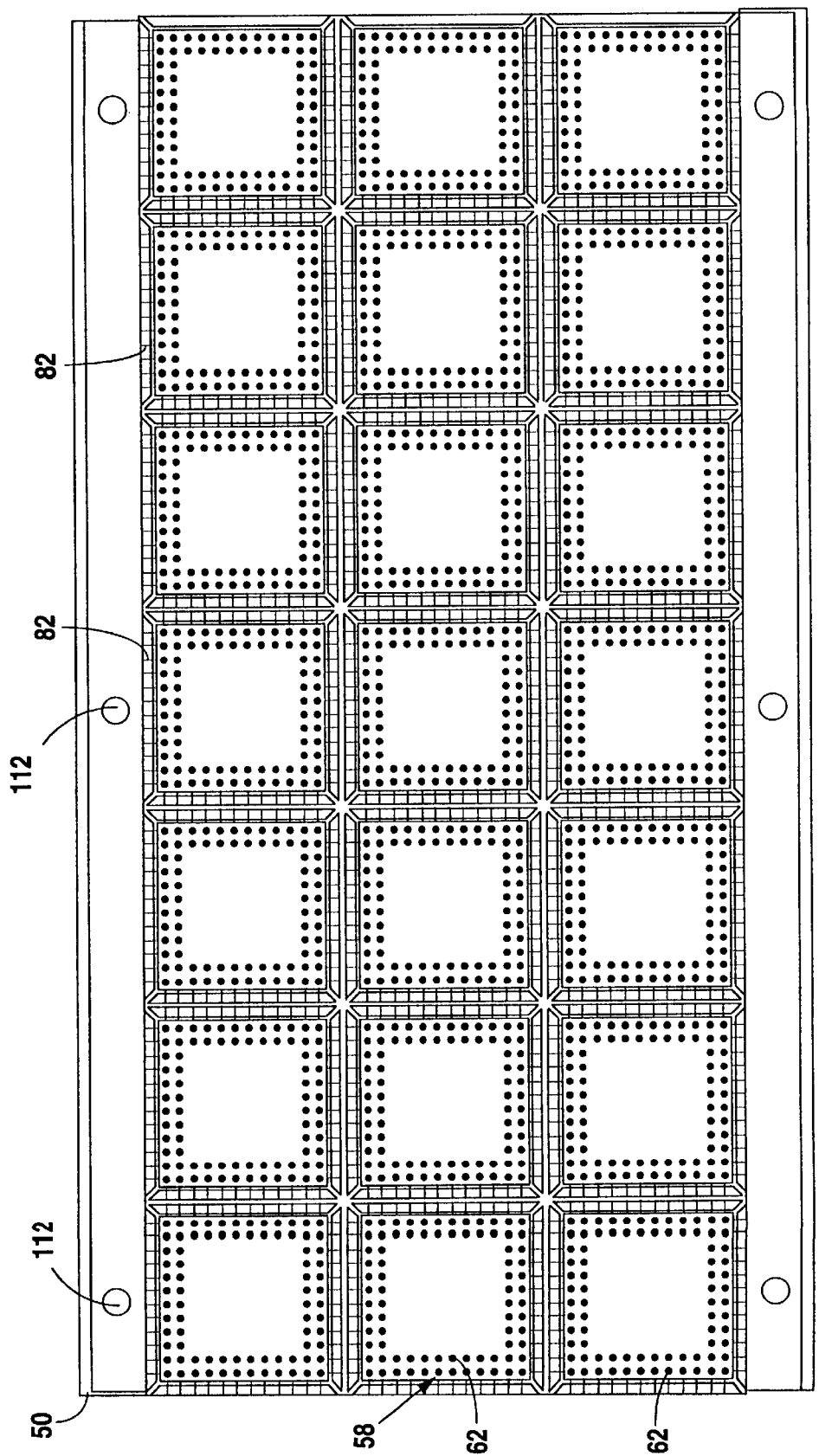
FIG. 6 is a top view of the nonpolymer sheet of FIG. 5 with laminated flex circuitry according to one embodiment of the disclosed method and apparatus.

In the embodiment of FIG. 3, patterned conductive layer 59 typically has a plurality of bonding leads 82, each of which are electrically coupled to a conductive pad 59a. Typically, bonding leads 82 are between about 25 microns and about 100 microns in width. Bonding leads 82 are for making electrical connection to semiconductor die 52 at die pads 84 by, for example, inner lead bonding, and are therefore configured with a similar pitch as die pads 84 and a length sufficient to allow mating between leads 82 and pads 84. However, leads 82 may also be formed to have pads 83 for wire bonding to semiconductor die 52 using wire bonds 82a as shown in FIG. 3A. In either case, when each bonding lead 82 is electrically connected to a respective die pad 84, a circuit is completed between each solder ball 54 and a corresponding die pad 84. When so configured to form a ball grid array, each solder ball 54 is designed to be used as an individual "pin" to electrically connect an individual die pad 84 to a corresponding substrate bonding pad 75 on a substrate 76. The pitch of ball grid array 57 as illustrated in FIG. 6, and of corresponding substrate bonding die pads 75, is typically between about 300 microns and about 1250 microns. Typically a substrate is a printed circuit board ("PCB"), but may also be any other circuitry including, but not limited to, flex circuitry, silicon, wafers, etc.

As shown in FIG. 3, edges of die 52 and inner lead connection areas are typically encapsulated by encapsulant 86 which is contained by encapsulating dams 88. Encapsulant 86 may be any suitable encapsulant known to those of skill in the art including, but not limited to, epoxy resin and silicone. Encapsulant dams 88 may be any suitable encapsulant containment structure including, for example, epoxy, adhesive tape, etc. Although the embodiment illustrated in FIG. 3 illustrates a chip scale package design employing a single patterned conductive layer 59, it will be understood with benefit of the present disclosure that embodiments having two or more patterned (or non-patterned) conductive layers are also possible.

In the embodiment of FIG. 3, nonpolymer pad 50 may be any material suitably rigid to facilitate processing and/or having a coefficient of thermal expansion close to that of a substrate in order to minimize stress on solder joints. By using such a nonpolymer pad configuration, formation of voids in die attachment adhesive 64 may be reduced or substantially eliminated. This is because die 52 is bonded directly to nonpolymer pad 60, with adhesive 64 and therefore moisture from polymer materials is not present and cannot enter at the interface between these two components.

In addition to reducing thermal stress and void formation, the nonpolymer pad configuration of the disclosed method and apparatus provides other significant advantages. For example, chip scale package strips including a nonpolymer support structure 10 provide a surface having improved flatness or surface uniformity over conventional elastomer pads. Flatness of a grid array support structure surface is an important factor toward ensuring that all solder balls 54 contact pads 75 on a substrate 76. Desirably, a chip scale package support structure has a coplanarity of about 2 mils or less, most desirably of about 1 mil or less. Such coplanarity is difficult to achieve using conventional soft elastomer pads. A nonpolymer support structure provides a more planar surface for solder ball attachment and therefore allows a more reliable connection between a semiconductor die and a substrate.

In addition to the benefits described above, a thermally conductive nonpolymer (such as a metal sheet or foil) may be used as nonpolymer support structure 50 to provide a good thermal path for dissipation of heat from the face of semiconductor die 52 in FIG. 3 (or from the backside of semiconductor die 52 in FIG. 3A). Such a thermally conducting nonpolymer support structure 50 may also conduct heat efficiently to the solder balls 54.

One type of thermally conductive nonpolymer typically employed is a metal sheet or foil, with copper being a particularly well suited metal for this purpose. In addition to thermal conductance, a metal sheet may also provide improved electrical shielding of conductor layers 59 and may help minimize crosstalk. In addition, a metal sheet offers a surface that is suitable for use as a ground plane. Thus, a metal sheet may also be used to provide a convenient ground plane (or power plane if desired), such as by direct electrical connection of a solder ball 54a to the metal sheet 53 as shown in FIG. 3B. This may be done, for example, through a via 55 in a conductive pad 59b and the underlying adhesive layer 56 so that selected ground connection solder balls 54a may electrically connect to the metal sheet 53. The ground pads on the die may then be connected to the ground solder balls 54a through inner leads or by wire bonds 82b as shown in FIG. 3B. Advantageously, when a metal sheet such as a copper foil is employed, these advantages may be achieved with relatively minimal cost. Suitable metal sheets include any patterned metal foil which supplies sufficient rigidity and/or thermal expansion qualities including, but not limited to metal foils made of copper, stainless steel, alloy 42, tungsten, titanium, aluminum, aluminum based metals (such as aluminum alloys), and alloys and combinations thereof, etc. Copper foil may also be coated with a thin plating for bonding to provide good solderability, low cost, and/or reduced oxidation. Examples of suitable coatings include, but are not limited to, a surface coating of plated nickel, nickel/boron, black copper oxide, tin/lead (such as a high lead content tin/lead alloy of over about 37% lead, or precious metals, such as silver or gold. Most typically, a nonpolymer support structure is a patterned copper foil having a thickness of between about 4 mils and about 10 mils, more typically between about 5 mils and about 7 mils. Copper alloys typically used for lead frames, such as 194, are well suited for this application.

Advantageously, when a nonpolymer pad of suitable rigidity is employed, a chip scale package strip may be handled with typical magazine feeding equipment commonly is used for lead frames. By "suitable rigidity" it is meant that a modulus greater than about 1 Mpsi ($1\times10^6$ pounds per square inch). Examples of nonpolymer materials having suitable rigidity include ceramic, and metal foils such as those described above. However, it will be understood that benefits of the disclosed method and apparatus may also be realized using nonpolymer materials having a modulus less than about 1 Mpsi. Such benefits include those described elsewhere herein.

Referring to FIG. 3, adhesive layers 56 and 64 may be any adhesive suitable for securing nonpolymer pad 50 to flexible tape 58 and semiconductor die 52. Typically, adhesive layers 56 and 64 are selected from dielectric materials that act with a nonpolymer pad 50 to isolate or "decouple" die 52 from a substrate (or PCB) 76, thus further relieving stress on solder joints and providing improved reliability. Such adhesives also act to provide a small amount of Z-axis compliance for socketing. Examples of suitable adhesives include, but are not limited to, an acrylate PSA, a thermoplastic polyimide (such as DuPont "KJ" material), a polyolefin, DuPont "PYRALUX", epoxy resins, and mixtures thereof. Most typically, thermoplastic polyimide is employed as adhesive layers 56 and 64.

Adhesive may be applied to a nonpolymer pad in any thickness suitable for forming a bond between the elastomer pad and adjacent surfaces, such as a die or circuit tracing. Typically, adhesive layers 56 and 64 have a thickness of between about 1 mil and about 3 mils, more typically between about 1 mil and about 2 mils.

Although the illustrated embodiments employ a single nonpolymer support structure, it will be understood with benefit of the present disclosure that more than one nonpolymer support structure may be employed in a laminated chip scale package tape assembly. For example, two or more electrically isolated metal support structures may be employed and used to form separate circuit paths (such as both ground and power planes), or combinations of metal and nonmetal nonpolymer support structures are also possible, such as epoxy printed circuit board material.

In an alternative embodiment illustrated in FIG. 3D, a mounting layer 351 may be patterned with a layer of deposited nonpolymer material 350 and employed between a semiconductor die 352 and accompanying circuitry. For example, mounting layer 351 may be adhered to two layer flexible circuit tape 318 or other intermediate circuitry with adhesive layer 356, and to semiconductor die 352 with adhesive layer 364. When employed instead of the nonpolymer support structure embodiments previously described, embodiments of nonpolymer layer 350 act to reduce or substantially eliminate void formation by substantially preventing moisture from escaping into die attachment adhesive 364. Advantageously, a mounting layer patterned with nonpolymer material may be manufactured in many ways including, but not limited to, as a separate tape component, or as attached to a TAB tape. In some cases, the use of a mounting layer patterned with nonpolymer material may be less expensive than embodiments of the nonpolymer support structure previously described.

Still referring to FIG. 3D, nonpolymer layer 350 may be composed of any nonpolymer material suitable for preventing the migration of moisture into adhesive layer 364, including those materials listed for use as a nonpolymer support structure. Mounting layer 351 may be any material suitable for patterning or deposition of nonpolymer layer 350, including those dielectric materials listed for use as patternable dielectric materials. Likewise, adhesive layers 356 and 364 may be any suitable adhesive or attachment means, including those listed for use with nonpolymer support structures. Typically nonpolymer layer 350 is a copper layer having a thickness of between about 1 $\mu$m and about 20 $\mu$m, and mounting layer 351 is a polyimide layer having a thickness of between about 1 mil and about 3 mils. Most typically, nonpolymer layer 350 is a copper layer having a thickness of between about 5 $\mu$m and about 10 $\mu$m, and mounting layer 351 is a polyimide layer having a thickness of about 2 mils.

FIG. 3D illustrates the use of a mounting layer 351 patterned with a nonpolymer layer 350 in an application similar to that shown in FIG. 3A for a nonpolymer support structure. As with embodiments of nonpolymer support structures, many variations are possible to the configuration illustrated in FIG. 3D. For example, a conductive nonpolymer layer 350 may be used as a ground plane, power plane or to complete other types of circuit paths, such as in a manner similar to that illustrated in FIG. 3B for a nonpolymer support structure. A mounting layer 351 and nonpolymer layer 350 may also be employed with intermediate circuitry having three or more layers, such as similar to the embodiment illustrated in FIG. 3C for nonpolymer support structures. In addition, more than one nonpolymer layer 350 may be employed.

Manufacture And Assembly Of Chip Scale Package Components

A chip scale package device of the disclosed method and apparatus having a nonpolymer support structure (or "pad") may be formed in a number of ways and for use in a number of different applications. For example, one method of constructing chip scale package tape having a nonpolymer pad includes the steps of laminating an adhesive onto a roll of nonpolymer material (such as metal foil), punching or stamping the nonpolymer material in a desired shape, and aligning and adhering flexed circuitry (or circuit tracing) to the nonpolymer to form a chip scale package tape (such as in the form of a strip). In the alternative, a chip scale package tape may be formed by punching a nonpolymer material (such as a metal foil) to a desired shape, punching an adhesive film to the same shape, aligning both film and foil with circuitry tracing, and laminating the structure. In either case, alignment of the circuit tracing to a nonpolymer support structure is accurate, yet relatively inexpensive. A variety of different steps may be performed using the chip scale package strip or tape just described to form a chip scale package device. These steps may include die attachment, wire and/or inner lead bonding, overmolding and/or solder ball attachment steps. Advantageously, assembly of chip scale package devices according to these processes is relatively efficient, straightforward, and cost effective.

Figure 4:
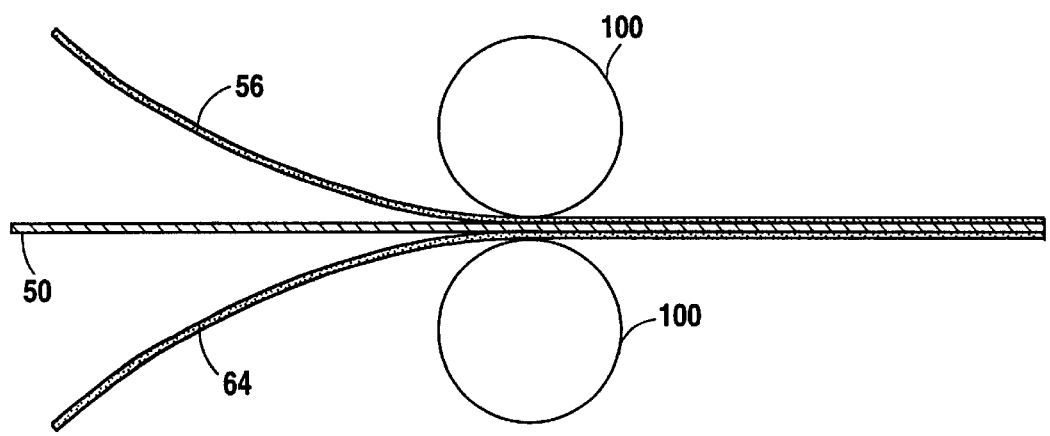
FIG. 4 is a cross-sectional representation illustrating lamination of adhesive layers to a thin nonpolymer material according to one embodiment of the disclosed method and apparatus.

FIG. 4 illustrates lamination of adhesive layers 56 and 64 to both sides of a thin roll of copper sheet (or foil) 50. Typically, adhesive laminate having a coversheet (or release liner) is employed, and the release liner is left on the side of adhesive layers 56 and 64 facing away from the copper foil 50. Suitable adhesive laminates incorporating release liners include acrylate PSA type adhesives. As shown in FIG. 4, laminate adhesive used to form adhesive layers 56 and 64 is typically applied using roll laminates 100. However, it will be understood with benefit of the present disclosure that adhesives, such as those previously mentioned, may be applied using any suitable method including, but not limited to, screen printing and spray deposition.

Figure 5:
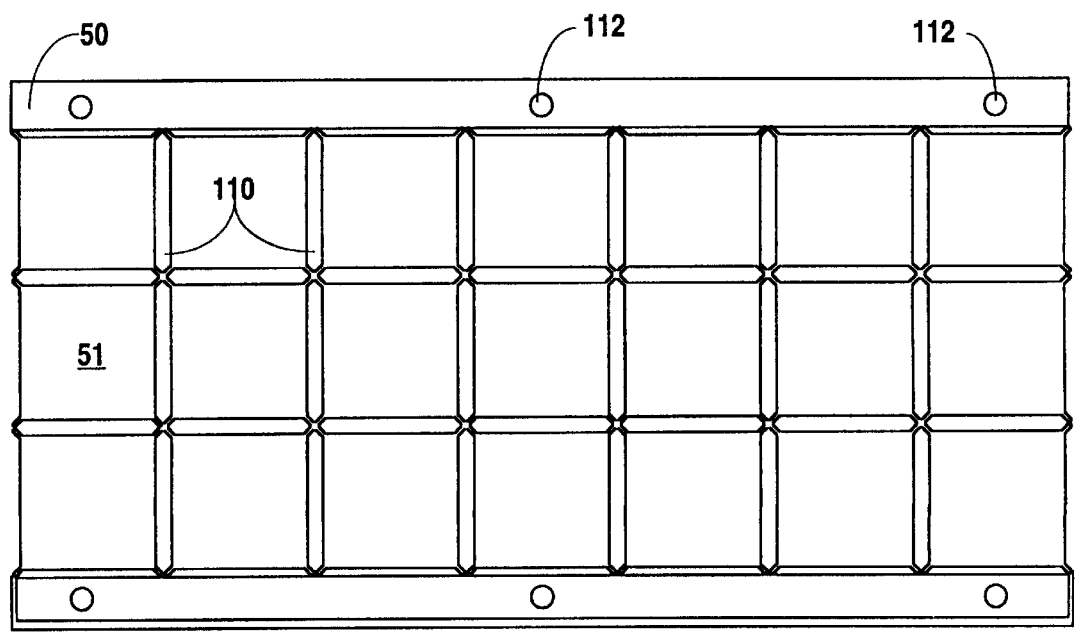
FIG. 5 is a top view of a sheet of nonpolymer material that has been laminated with adhesive and punched according to one embodiment of the disclosed method and apparatus.

FIG. 5 shows a top view of a nonpolymer sheet 50 that has been laminated with adhesive layers 56 and 64. In FIG. 5, nonpolymer sheet 50 has been punched or stamped to form patterns having die squares 51 surrounded by connection slot regions 110. Die squares 51 are configured to have a shape complementary to a semiconductor die 52 and are smaller in area to allow clearance for connection of leads 82 (or wire bonds) to die pads 84 in the connection slot regions 110. Connection slots 110 provide space for connection to die pads 84 using inner lead bonding, wire bonding. or other suitable connection methods. Taken together, the dimensions of die squares 51 and connection slots 110, provide individual platforms for semiconductor dies 52.

It will be understood with benefit of the present disclosure that stamping or punching operations in the disclosed method may be performed using any punching or stamping method suitable for integrated circuit packaging. The nonpolymer sheet can also be patterned by chemical etching, using a steel rule die, or using a chem etched die. Tooling holes 112 are also punched in the sheet 50 to aid in the accurate alignment of circuitry.

Next, as shown in FIG. 6, flexible tape 58 having vias 62 for accepting solder balls is aligned with the use of tooling holes 112 and laminated to one side of copper sheet 50. Lamination of circuitry may be accomplished in a number of ways, including in a roll-to-roll process (such as a roll-to-roll process using sprocket holes), or in a press. In this embodiment, prior to lamination the release liner is typically pulled off the adhesive layer 56 and a panel or strip of circuits is laminated to the sheet 50 using tooling holes 112 for alignment. However, other adhesive and lamination methods, such as those mentioned previously, may be employed.

At this point, attachment and bonding of an integrated circuit die may continue uninterrupted, or the nonpolymer sheet 50 and the attached flexible tape 58 may be shipped elsewhere for further assembly. In the latter case, the nonpolymer sheets 50 and the attached flexible tape 58 are typically cut into a strip format prior to shipping. In a strip format, a single chip scale package strip typically has numerous individual die squares 51. In either case, further assembly typically involves removal of the second release liner from adhesive layer 64 in preparation for mounting a die onto the nonpolymer sheet 50. In the case of strip format processing, strips of nonpolymer sheets and attached circuitry are loaded into magazines for processing. Die are then typically placed on the tacky side of the nonpolymer strip (opposite the side with the circuitry) and cured if necessary. However, it will be understood with benefit of this disclosure that a die may also be picked and placed onto a roll of nonpolymer sheets (as opposed to a strip), and that a semiconductor die may be placed with its circuitry level adjacent or opposite the nonpolymer sheet. The die side of the nonpolymer strip may also be left bare of adhesive and a die attached adhesive (typically epoxy based materials) used for attachment of the die.

Next, the strips (including circuitry and one or more dies) are typically flipped and placed into standard magazines which are loaded into, for example, a wire bond machine or a thermocompression bond machine As shown in FIG. 7, each lead 120 from the tape is bonded to a die pad 122 using, for example, a bonding tool 124. A fixture 126 is used to support the tape (including the dies) so as to allow the leads 120 to break at a frangible portion (or notch) 126 during the bonding process. As shown in FIG. 8, the strip may then be overmolded by filling in the slots 110 with encapsulant 132. Typically the encapsulant is contained by dam features 130 and cured using a suitable curing method such as, for example, UV or thermal methods. Alternatively, as shown in FIG. 9, the strips may be flipped over onto a fixture surface 140 and the slots 110 filled with encapsulant 132 from the die side of the strip without need for encapsulant dam features. As shown in FIGS. 3A and 3B, a die 52 may also be connected to a circuit trace layer 59 using wire bonds 82a such as, for example, when a semiconductor die is "flipped" so that the circuit layer and die pads of a semiconductor die are oriented in a direction facing away from the support structure. An overhead view of such an embodiment is shown in FIG. 6A.

As shown in FIG. 10, solder balls (or bumps) 54 may next be mounted within openings (or vias) 62 formed, for example, by etching openings within a polyimide layer 60. Solder balls 54 may be attached to strips using any method suitable for forming a secure electrical connection between the balls 54 and the conductive bonding pads 59a including, for example, heating and reflow using any conventional means such as IR, convection, or vapor phase. Although not shown, vias 62 may also be processed as plated through holes (PTH) and/or be filled with a separate conducting filler material prior to solder ball attachment.

At this point, a strip or roll may be cut to form single or multiple die chip scale package packages (a single die package 150 is shown in FIG. 10). This may be accomplished using any suitable excision method such as, for example, punching, cutting, or other similar process.

It will be understood with benefit of the present disclosure that other chip scale package configurations may also be fabricated using this method, including packages having more than one semiconductor dies. In addition, non-chip scale package configurations, such as conventional BGA packages, may be manufactured using the disclosed method and apparatus concepts. It will also be understood that although the methods just described and illustrated are for manufacturing integrated circuits using a strip format, benefit of these methods may also be obtained when used to manufacture integrated circuits using other processes and formats, including, but not limited to, integrated circuits formed using a roll-to-roll (or reel-to-reel) format. In this way benefits of the disclosed method and apparatus may be realized in formats compatible with existing industry infrastructure and with newer formats currently being employed or developed. It will also be understood that the aforementioned packaging process may be performed while with a die still in wafer form. For example, a nonpolymer sheet may be aligned and adhered directly to a wafer and chip bonding performed. As before, slots may then be filled in with encapsulant, solder balls attached, and individual package pieces punched or sawed out.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims.

What is claimed is:

1. A package for an integrated circuit, comprising:
   an intermediate circuit including electrical interconnects;
   at least one nonpolymer layer having first and second sides, said first side of said layer being structurally coupled to said integrated circuit, and said second side of said layer being structurally coupled to said intermediate circuit, wherein the at least one nonpolymer layer extends to cover all of the electrical interconnects of the intermediate circuit, and wherein the nonpolymer layer is larger than the integrated circuit, wherein said nonpolymer layer is conductive and wherein said nonpolymer layer is electrically coupled to said integrated circuit to form a power or ground plane.

2. A package for an integrated circuit, comprising:
   an intermediate circuit including electrical interconnects;
   at least one nonpolymer layer having first and second sides, said first side of said layer being structurally coupled to said integrated circuit, and said second side of said layer being structurally coupled to said intermediate circuit, wherein the at least one nonpolymer layer extends to cover all of the electrical interconnects of the intermediate circuit, and wherein the nonpolymer layer is larger than the integrated circuit, wherein said nonpolymer layer is a nonpolymer support structure comprised of a metal foil having a thickness of between about 4 mils and about 10 mils.

3. A package for an integrated circuit, comprising:
   an intermediate circuit including electrical interconnects;
   at least one nonpolymer layer having first and second sides, said first side of said layer being structurally coupled to said integrated circuit, and said second side of said layer being structurally coupled to said intermediate circuit, wherein the at least one nonpolymer layer extends to cover all of the electrical interconnects of the intermediate circuit, and wherein the nonpolymer layer is larger than the integrated circuit, wherein said nonpolymer layer is a nonpolymer support structure comprised of a copper foil.

4. A package for an integrated circuit, comprising:
   an intermediate circuit including electrical interconnects;
   at least one nonpolymer layer having first and second sides, said first side of said layer being structurally coupled to said integrated circuit, and said second side of said layer being structurally coupled to said intermediate circuit, wherein the at least one nonpolymer layer extends to cover all of the electrical interconnects of the intermediate circuit, and wherein the nonpolymer layer is larger than the integrated circuit; and
   a mounting layer having first and second sides, said first side of said mounting layer being structurally coupled to said second side of said nonpolymer layer, and said second side of said mounting layer being structurally coupled to said intermediate circuit.

5. The package of claim 4, wherein said mounting layer is a polyimide layer having a thickness of between about 1 mil and about 3 mils, and wherein said nonpolymer layer is a copper layer having a thickness of between about 1 $\mu$m and about 20 $\mu$m.

6. A package for an integrated circuit, comprising:
   an intermediate circuit including electrical interconnects;
   at least one nonpolymer layer having first and second sides, said first side of said layer being structurally coupled to said integrated circuit, and said second side of said layer being structurally coupled to said intermediate circuit, wherein the at least one nonpolymer layer extends to cover all of the electrical interconnects of the intermediate circuit, and wherein the nonpolymer layer is larger than the integrated circuit, wherein said intermediate circuit is a flexible circuit.

7. An electronic package, comprising:
   a patterned conductive layer having first and second sides and an outer lateral boundary, said conductive layer being patterned to form an electrically conductive region having peripheral conductive features disposed around a circumference of said outer lateral boundary for electrical connection to a semiconductor device;
   a patterned dielectric layer having first and second sides and an outer lateral boundary with a smaller circumference than said circumference of said patterned conductive layer, said dielectric layer being patterned to form a plurality of openings extending through said dielectric layer, each of said openings being configured to receive a solder ball, and wherein said first side of said conductive layer is joined to said second side of said dielectric layer so that said plurality of openings in said dielectric layer are aligned with at least part of said electrically conductive region of said conductive layer and so that said peripheral conductive features of said conductive layer extend beyond the outer boundary of said dielectric member;
   a nonpolymer support structure having first and second sides, said support structure being substantially rigid and having an elastic modulus greater than about 1 Mpsi, and said first side of said support structure being structurally coupled to said second side of said conductive layer, the nonpolymer support structure having an outer lateral boundary with a circumference smaller than the circumference of said patterned conductive layer and extending over all of the openings of the patterned dielectric layer;

a semiconductor device having a first side structurally coupled to said second side of said nonpolymer support structure, said semiconductor device including a plurality of electrical contact sites; at least one of said contact sites being electrically coupled to said peripheral conductive features of said conductive layer wherin the semiconductor device has an outer lateral boundary with a circumference smaller than the circumference of the nonpolymer support structure; and a plurality of solder balls disposed on said first side of said dielectric layer, each of said solder balls being positioned in one of said plurality of openings in said dielectric layer and being electrically connected to said conductive region of said conductive layer.

8. The package of claim 7, wherein said electrical contact sites of said semiconductor device are electrically coupled to said peripheral conductive features of said conductive layer by means of wire bonds, inner lead bonds, or a mixture thereof.

9. The package of claim 7 wherein said nonpolymer support structure is electrically conductive and wherein said nonpolymer support structure is electrically coupled between at least one of said electrical contact sites of said semiconductor device and said conductive layer, such that said nonpolymer support structure forms an electrical circuit between said semiconductor device and said conductive layer.

10. A package for an integrated circuit, comprising:

an intermediate circuit including electrical interconnects;

at least one nonpolymer layer having first and second sides, said first side of said layer being structurally coupled to said integrated circuit, and said second side of said layer being structurally coupled to said intermediate circuit, wherein the at least one nonpolymer layer extends to cover all of the electrical interconnects of the intermediate circuit, and wherein the nonpolymer layer is larder than the integrated circuit, wherein said integrated circuit has a plurality of peripheral contacts on a first side of the integrated circuit, and wherein the nonpolymer layer is coupled to a side of said integrated circuit opposite said first side.

* * * * *

UNITED STATES PATENT AND TRADEMARK OFFICE
CERTIFICATE OF CORRECTION

PATENT NO.: 5,990,545
DATED: November 23, 1999
INVENTOR(S): Randolph D. Schueller and John D. Geissinger It is certified that error appears in the above-identified patent and that said Letters Patent is hereby corrected as shown below:

In column 16, line 16, "larder" should be - -larger- -.

Signed and Sealed this

Seventeenth Day of April, 2001

Attest:

NICHOLAS P. GODICI

Attesting Officer     Acting Director of the United States Patent and Trademark Office